United States Patent [19]
Osada et al.

[11] Patent Number: 5,275,782
[45] Date of Patent: Jan. 4, 1994

[54] HOUSING FOR SEMICONDUCTOR DEVICE

[76] Inventors: Mitsuo Osada; Yugaku Abe; Tetsuya Hayoshi, all of c/o Itami Works of Sumitomo Electric Industries, Ltd., 1-1 Koyakita 1-chome, Itami, Hyogo, Japan

[21] Appl. No.: 712,253

[22] Filed: Jun. 7, 1991

Related U.S. Application Data

[62] Division of Ser. No. 641,499, Jan. 15, 1991, Pat. No. 5,132,779.

[30] Foreign Application Priority Data

Jan. 22, 1990 [JP] Japan ................................ 2-13091

[51] Int. Cl.$^5$ ............................ B22F 3/16; B22F 3/00
[52] U.S. Cl. ........................................ 419/60; 419/10; 419/38
[58] Field of Search ..................... 419/10, 30, 38, 60, 419/54, 55

[56] References Cited

U.S. PATENT DOCUMENTS

| | | | |
|---|---|---|---|
| 4,460,541 | 7/1984 | Singleton et al. | 419/42 |
| 4,702,885 | 10/1987 | Obani et al. | 419/23 |
| 4,830,820 | 5/1989 | Itoh et al. | 419/23 |
| 4,838,936 | 6/1989 | Akechi | 75/249 |
| 4,898,612 | 2/1990 | Gilman et al. | 75/249 |
| 4,926,242 | 5/1990 | Itoh et al. | 357/81 |
| 5,039,476 | 8/1991 | Adachi et al. | 419/13 |

Primary Examiner—Daniel D. Wasil
Assistant Examiner—Daniel Jenkins

[57] ABSTRACT

A housing for a semiconductor device is improved to avoid thermal distortions. The housing is formed of an Al-Si compound material and includes a housing member having a space for holding the semiconductor device. Occlusion gas contained in the Al-Si compound material is removed so that at least any nitrogen gas remaining in occlusion after degassing is 0.1 percent by weight or less. Since the housing member substantially does not contain occlusion gas, the housing is not subject to thermal distortion even though the housing is exposed to heat in operation.

3 Claims, 10 Drawing Sheets

HOUSING FOR SEMICONDUCTOR DEVICE

CROSS-REFERENCE TO RELATED APPLICATIONS

This is a divisional of U.S. patent application Ser. No. 07/641,449 filed, Jan. 15, 1991, now U.S. Pat. No. 5,132,779.

FIELD OF THE INVENTION

The present invention relates generally to housings for semiconductor devices, and more particularly, to housings for semiconductor devices which are improved not to be distorted due to heating.

BACKGROUND INFORMATION

There is an increasing demand for lightweight electronic devices mounted on flying bodies such as aircrafts, artificial satellites and missiles. In recent years in particular, with the increased kinds and numbers of electronic apparatuses mounted on such flying bodies, the requirements on lightweight housings for housing electronic parts incorporated in electronic apparatuses have become even more demanding.

Aluminum has been conventionally used as a material for a housing of this type. Aluminum is light in weight (specific gravity if about 2.7 g/cc) but has a large thermal expansion coefficient ($24 \times 10^{-6}/°C$.) Therefore, in connecting a ceramic substrate having a thermal expansion coefficient of $6-7 \times 10^{-6}/°C$., with electronic parts mounted thereon to a housing by soldering using a lead tin, gold tin or the like solder, the difference between the thermal expansion coefficient of the substrate and that of the housing is so large that warping in a junction portion and cracking in the ceramic substrate are produced.

In addition, an increased number of ceramic substrates has been recently used for mounting FETs or ICs requiring a large heat dissipation. In this case, the ceramic substrate is fixed to a housing by soldering or the like and the housing is cooled, thereby causing the generated heat to escape through the cooled housing to the exterior. In such a case, since aluminum having a large thermal expansion coefficient cannot be used as a material for the housing, such materials as Fe-Ni-Co with a specific gravity of, of 10-11 g/cc, and a thermal conductivity of 0.03 cal/cm.sec. °C. or similar materials are used, sacrificing lightness and a thermal conductivity.

It is also known to use an Al-Si compound material manufactured by a rapid solidification method, as a material for a substrate on which a semiconductor device is mounted and as a material for a heat radiation fin, see U.S. Pat. Nos. 4,830,820, 4,926,242. The Al-Si compound material comprises 35-40% by weight of Si: 65-55% by weight of Al is manufactured by the quenching method and has a specific gravity of about 2.5 g/cc which is smaller than that of aluminum, and a relatively high thermal conductivity of 0.3 cal/cm-.sec-°C. Therefore, such material is considered to be suitable for making housings of the type mentioned.

A housing formed of this Al-Si compound material is made by hot working and cutting, alloy powder obtained by rapid solidification melted Al 60% by weight and Si 40% by weight through an atomizing method.

However, this Al-Si compound material has the following disadvantages when used for a housing.

First, distortion is produced when processing such a housing. That is, since a housing of this kind in general should be cooled when used, the housing must be attached to a cooling device. The deformation of the rear of the housing should be accordingly minimized by correcting the same by a heat treatment. Heating the housing obtained by such methods as described above, that is, obtained by cutting a material made of quenched powder formed by hot working, causes the housing to be greatly distorted due to an occlusion gas ($N_2$, $H_2$, $H_2O$ etc.) included in the material. In this case, even if the heating is carried out in a vacuum or in an inactive gas such as argon, the above-described distortion is produced due to the emission of the occlusion gas. This is the first disadvantage.

A second disadvantage is the thermal distortion after plating. In many cases, a surface of such a housing should be plated with Ni, Ni+Au or the like to make it easier to solder the housing and to give the same a good corrosion resistance. The heating performed after the plating results in emission of an occlusion gas which cause distortion of the housing. The heating after soldering the ceramic substrate or the like to the housing also results in emission of an occlusion gas, thereby further distorting the housing. In this case, the plated layer is expanded. The foregoing is the second disadvantage.

A third disadvantage is seen in that welding a cover made of an aluminum alloy, to the housing by using a laser beam, produces bubbles at the welded portion and causes the formation of coarse Si particles. Both of these phenomena significantly deteriorate the airtightness and the hardness reliability after the welding of the cover to the housing. While the bubbles are mainly caused by the emission of an occlusion gas as described in the first disadvantage at the time of fusing a welded portion, these bubbles are also caused the coarse Si particles which will be described in the following. The Al-Si compound material formed by the quenching method is characterized by the dispersion of fine particles of Si into the Al through rapid solidification, and in that, when the melted portion at the time of welding is slowly cooled, the Si particles become coarse when being solidified, thereby producing cavities in the Al in the periphery of the Si particles, which makes the welded portion fragile.

SUMMARY OF THE INVENTION

It is an object of the present invention to provide a housing for a semiconductor device having a small thermal expansion coefficient and enhanced thermal conductivity.

Another object of the present invention is to improve a housing for a semiconductor device so as to avoid distortion when heat is applied to the housing.

A further object the present invention is to provide a housing for a semiconductor device from which no occlusion gas is emitted at the time of heating.

A further object of the present invention is to provide a housing for a semiconductor device having an improved airtightness and reliability in hardness after jointing a housing member and a cover.

A further object of the present invention is to provide a housing for a semiconductor device which assures that a connection portion between a housing member and a cover does not become fragile.

A further object of the present invention is to provide a housing for a semiconductor device which housing is not distorted when exposed to heat.

A further object of the present invention is to provide a housing for a semiconductor device that will substantially not warp.

A further object of the present invention is to provide a housing for a semiconductor device which housing is formed of an Al-Si compound material and having a cover attaching portion formed of an aluminum alloy layer.

In order to attain the above-described objects, the housing for a semiconductor device according to the present invention includes a housing member formed of an Al-Si compound material having a cavity for housing a semiconductor device. The occlusion gas included in the above-described Al-Si compound material is removed so that at least a nitrogen gas remaining occluded after degassing is 0.1 percentage by weight or less.

In accordance with another aspect of the invention, the present housing for a semiconductor device, is manufactured by first preparing an Al-Si rapidly solidified powder. The Al-Si rapidly solidified powder is formed by hot working into an Al-Si compound material. The Al-Si compound material is placed in a vacuum of $10^{-3}$ torr or below, at a temperature of 300°-500° C. to remove occlusion gas included in the Al-Si compound material. The Al-Si compound material is processed by cutting to form a housing member.

The heating temperature is limited to 300°-500° C. Temperatures below 300° C. are not very effective in removing occluded gasses. The upper limit is settled to 500° C. taking into consideration that an eutectic point between Si and Al is at 570° C.

According to a further aspect of the invention, the present housing for a semiconductor device, is manufactured by first preparing an Al-Si rapidly solidified powder. The Al-Si rapidly solidified powder is molded by static pressure and the molding is put in a sheath tube made of an Al alloy. The sheath tube and the Al-Si compound molding are extrusion-molded as a unit to form a material with an Al alloy layer provided on the peripheral surface of the Al-Si compound material. The above-described material is placed in a vacuum of $10^{-3}$ torr or below, at a temperature of 300°-500° C. to remove occlusion gas included in the material. The so produced material is then cut so as to have the above-described Al alloy layer appear on the surface of the material which is then further cut to form a housing member.

In a housing for a semiconductor device according to the present invention the occlusion gas originally contained in the Al-Si compound material is reduced so that at least any remaining nitrogen gas in the occlusion gas is 0.01 percent by weight or less. As a result, no gas is emitted during a thermal processing after the formation of the housing. Therefore, thermal distortion caused by the remaining occlusion gas, is prevented.

According to a manufacturing method for a housing for a semiconductor device in accordance with a further aspect of the present invention, the Al-Si compound material is placed in a vacuum of $10^3$ torr or below, at a temperature of 300°-500° C. to remove the occlusion gas contained in the above-described Al-Si compound material, whereby no gas is emitted from the so obtained housing even if the housing is subjected to a thermal processing thereafter. Thermal distortions otherwise caused by the occlusion gas at the time of heating, has been prevented.

A further embodiment of the present housing for a semiconductor device uses an aluminum alloy layer formed on a surface of a cover portion of the present housing, whereby any welding can easily be performed between aluminum and aluminum.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 16 A, B, and C are diagrams showing another manufacturing step of the housing member with an aluminum layer provided on a surface of a cover attachment portion.

DETAILED DESCRIPTION OF PREFERRED EMBODIMENTS

Figure 1:
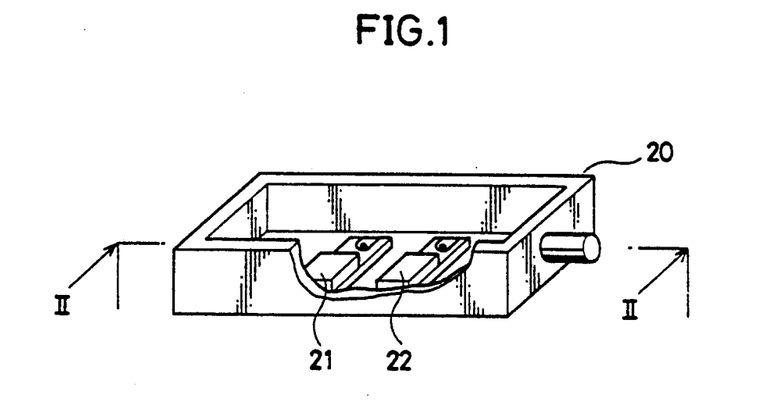
FIG. 1 is a perspective view of a housing for a semiconductor device according to one embodiment of the present invention.
Figure 2:
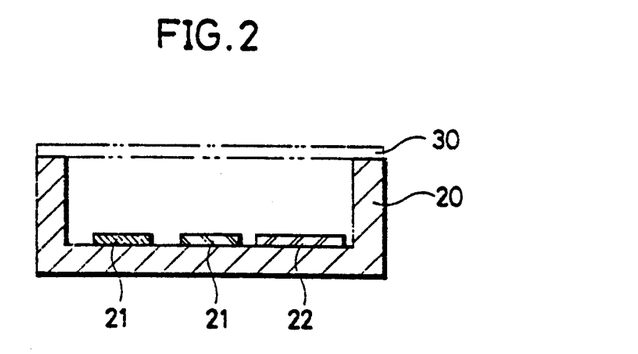
FIG. 2 is a sectional view taken along the line II—II of FIG. 1.

FIG. 1 is a perspective view of a housing for a semiconductor device according to one embodiment of the present invention. FIG. 2 is the sectional view taken along the line II—II of FIG. 1. Referring to FIGS. 1 and 2, the housing for a semiconductor device comprises a housing member 20 enclosing a space for holding a semiconductor device 21, a circuit board 22 and the like. A cover 30 is attached to the housing member 20. The housing member 20 is formed of an Al-Si compound material, referred to as A-40 hereinafter, containing 60% by weight of Al and 40% by weight of Si. In the A-40 used in the embodiment, the occlusion gas contained therein is removed such that at least the percentage by weight of the nitrogen gas is not larger than 0.01. Even if the heat is applied thereafter, the housing member 20 formed of the A-40 from which the occlusion gas has been removed, is not distorted due to the heat caused by the emission of the gas.

Figure 3:
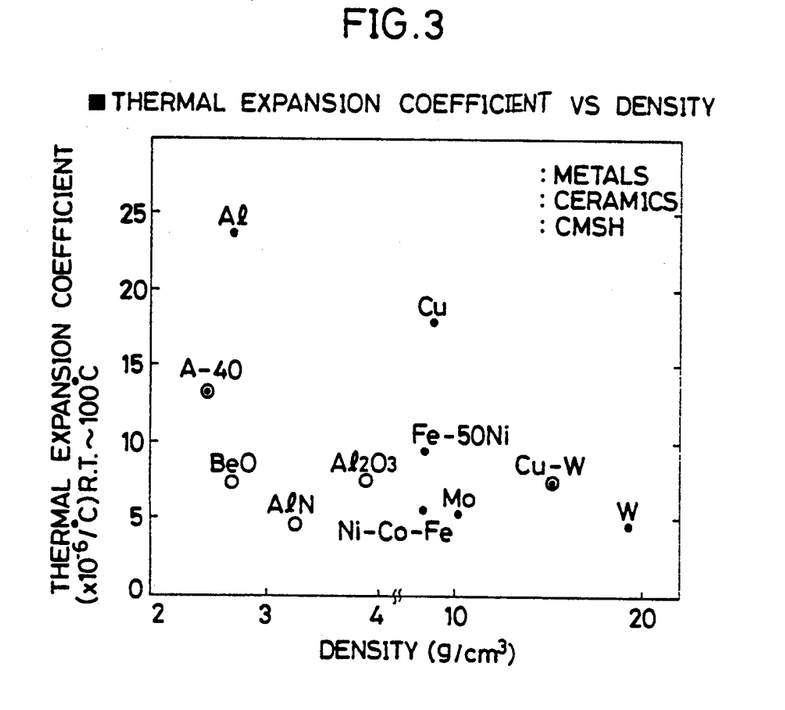
FIG. 3 is a diagram showing the relationship between the density and the thermal expansion coefficient of various metals.

Referring to FIG. 3, the A-40 has a thermal expansion coefficient approximate to that of ceramics. Therefore, when a ceramic substrate with electronic parts mounted thereon is connected to the housing by soldering or the like, no warping at the connected portion nor any cracking in the ceramic substrate is produced at the time of the connection.

Figure 4:
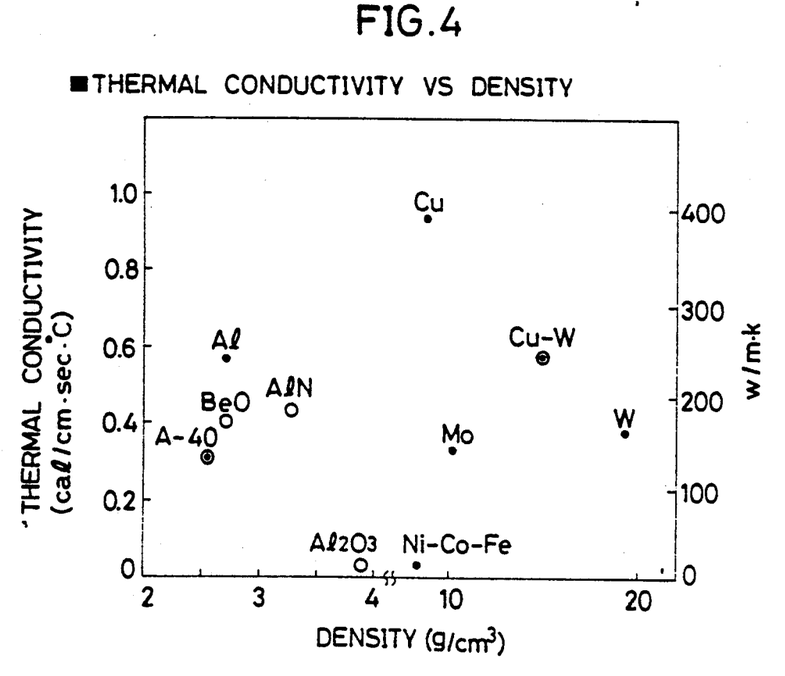
FIG. 4 is a diagram showing the relationship between the density and the thermal conductivity of various metals.

In addition, referring to FIG. 4, the A-40 has a small specific gravity and a relatively high thermal conductivity and therefore it is suitable for use as a housing material for the present purposes.

The manufacturing method of the housing member shown in FIG. 1 will be described.

Figure 5:
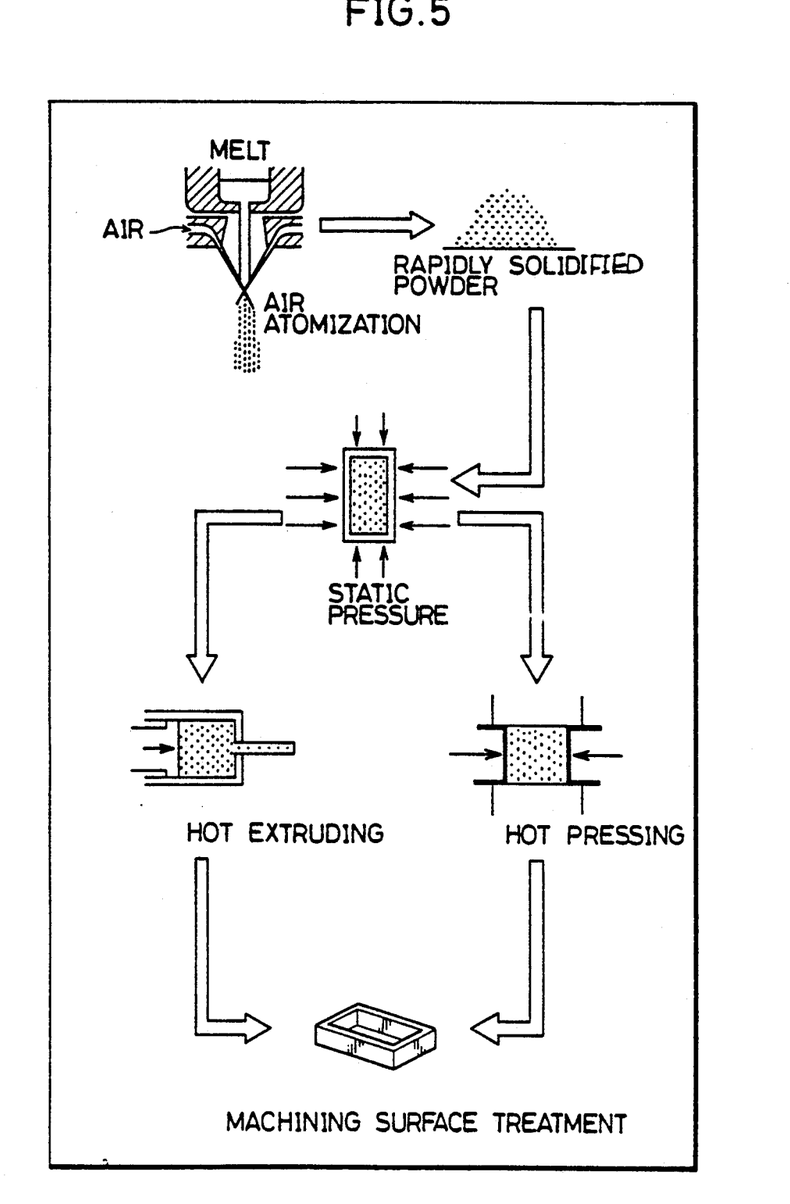
FIG. 5 is a diagram showing the manufacturing steps for producing a housing for a semiconductor device according to the present invention.

Referring to FIG. 5, rapidly a solidified powder of Al-Si alloy containing 40% by weight of Si and 60% by weight of Al, was prepared by an air atomization method. This rapidly solidified powder was molded by static pressure and then formed by hot working such as hot extruding or hot pressing, into a solid material.

Figure 6:
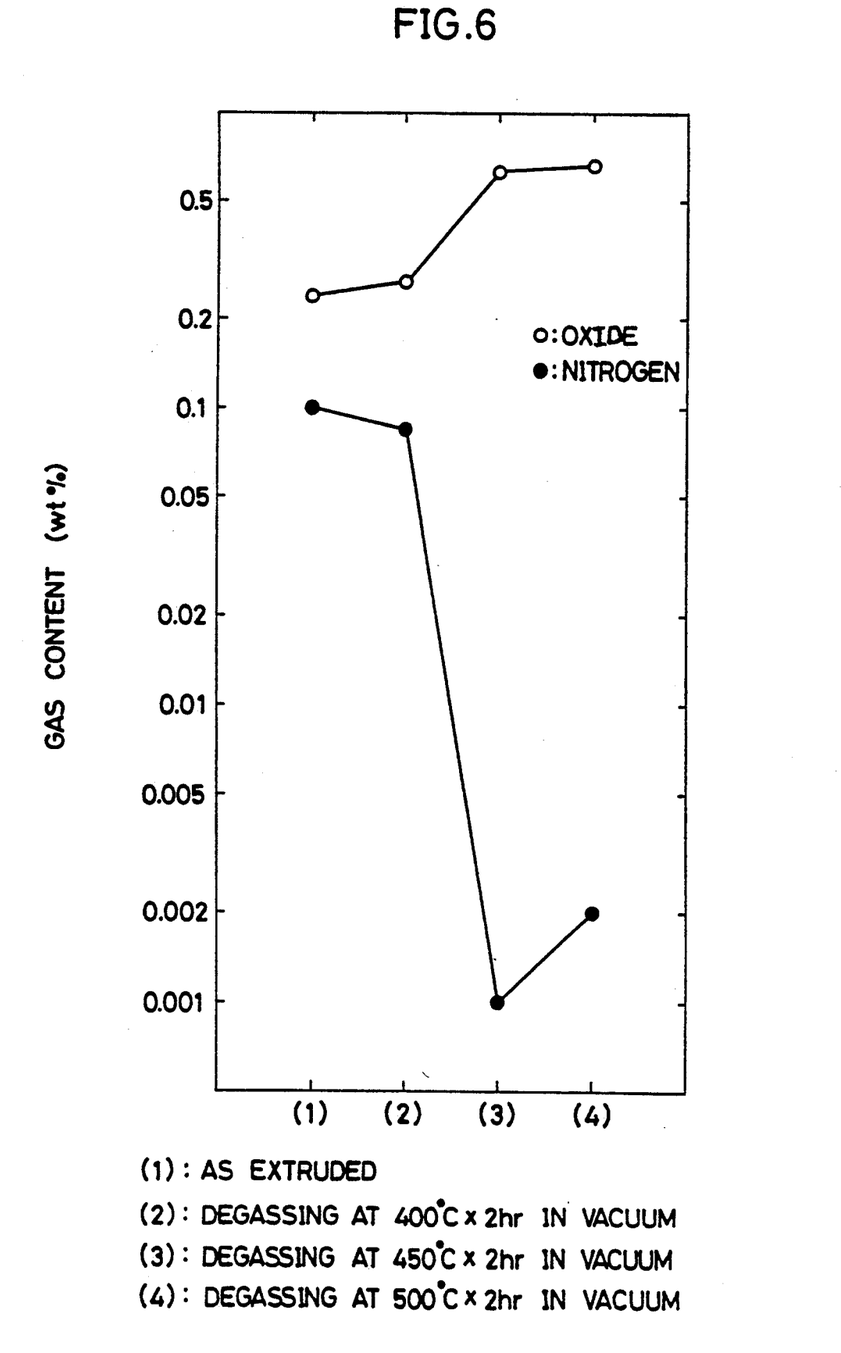
FIG. 6 is a diagram showing the relationship between conditions and gas contents in a degassing process of an Al-Si compound material.

Then, although not shown, the obtained material was subjected to a heat treatment for two hours under a pressure of $10^{-3}$ torr or below, at a temperature of 450° C. This treatment is referred to as a degassing hereinafter. The graph of FIG. 6 shows how the occlusion gas has been removed from the material by the degassing. The remaining nitrogen gas contained in the material was found to be not larger than 0.001% by weight. Before the degassing, the material contained nitrogen gas of at least 0.1% by weight, oxygen gas of at least 0.2% by weight, hydrogen gas and water vapor. While the contents of the gasses of hydrogen and water vapor could not be determined, it is considered that these gasses, hydrogen and water vapor, are removed to a considerable extent under the above-described degassing condition. In any event the content of the nitrogen gas is 0.01% by weight of less after the degassing. No decrease of the oxygen gas was noted; which means oxygen combined with the metal material (Al, Si) to form oxide, and the oxygen was analyzed. Therefore, the oxygen rarely exists as a gas in the material.

Subsequently, the material subjected to the degassing was cut or machined to obtain the housing member from which the occlusion gas was removed.

EXAMPLE 1 AND COMPARATIVE EXAMPLE 1

Figure 7:
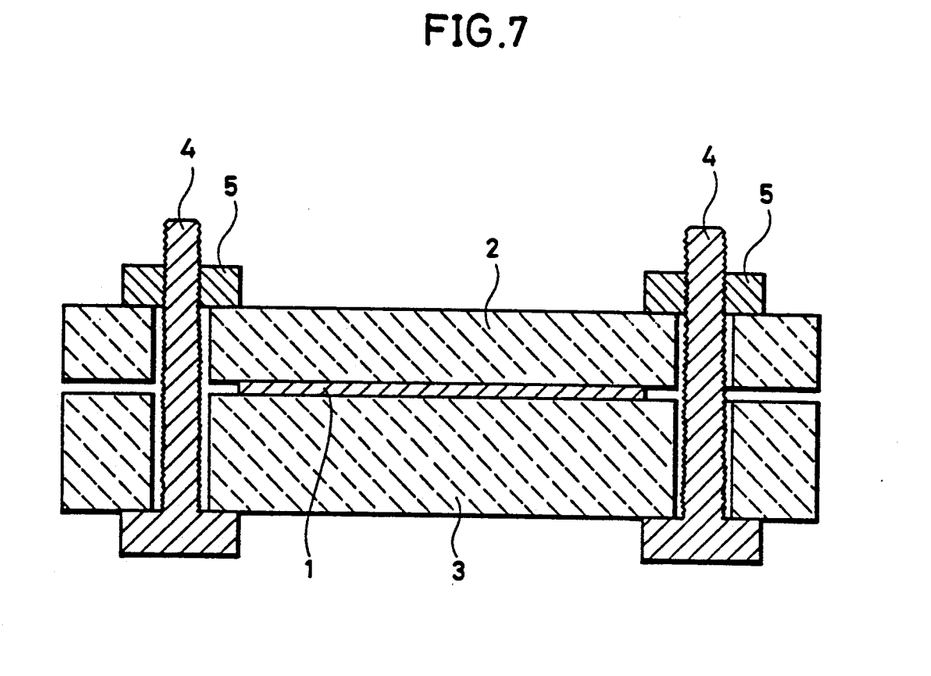
FIG. 7 is a sectional view showing the correcting of a curvature in a test piece by using a jig for such correcting.

A test piece of 3 mm×10 mm×100 mm was cut out of the above-described material subjected to the degassing and the test piece was subjected to a process for correcting any warping of the test piece by using a jig as shown in FIG. 7. Referring to FIG. 7, the correction of the warping of the test piece 1 was carried out by interposing the test piece 1 between the surfaces of an upper steel plate 2 and a lower steel plate 3, fastening the opposite ends thereof with a steel bolt 4 and a steel nut 5 and heating the entire unit with the jigs attached thereto in a vacuum of $10^{-3}$ torr or below at a temperature of 450° C. for thirty minutes.

At the same time, as an example for comparison 1, the warping correcting process was performed under the same condition by using a test piece which was not subjected to the above-described degassing.

Figure 8:
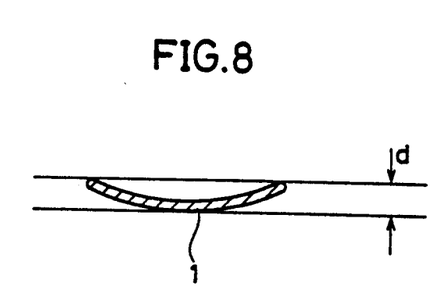
FIG. 8 is a sectional view showing how the curvature of a test piece is measured.

Referring to FIG. 8, the extent of the warping of the sample 1 could be obtained by measuring a difference d in height between the center portion and the end portion of the test piece 1.

The results thereof are shown in Table 1.

TABLE 1

| | Sample | 1 | 2 | 3 | 4 | 5 | average |
|---|---|---|---|---|---|---|---|
| Example 1 | before correcting warping | 55 | 60 | 45 | 60 | 50 | 54 |
| | after correcting warping | 23 | 25 | 30 | 15 | 20 | 23 |
| Comparative Example 1 | before correcting warping | 70 | 80 | 60 | 75 | 75 | 72 |
| | after correcting warping | 155 | 175 | 140 | 160 | 180 | 162 | unit: μm/100 mm

Referring to Table 1, in the case of the Example 1, a difference in the warping is small between the test piece before the correction of warping and the test piece after the same. This means that a warping correcting process is not required when a housing member is formed of a material of the Example 1, that is, the material has been subjected to a degassing.

On the contrary, in the case of the Example for comparison 1, it was found that the warping was increased after the correction of warping. This is because the occlusion gas in the material was emitted during the warping connection, thereby distorting the test piece.

EXAMPLE 2 AND COMPARATIVE EXAMPLE 2

Figure 9:
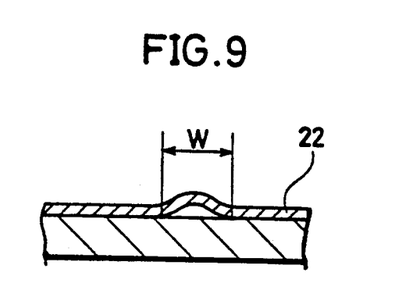
FIG. 9 is a sectional view showing how a blister of a plated layer is measured quantitatively.

As the Example 1, the Al-Si compound material was formed by hot working in accordance with FIG. 5. This Al-Si compound material was subjected to the above-described degassing process. The test piece cut out of the Al-Si compound material not subjected to a degassing (Example for Comparison 2) and the test piece cut out from the Al-Si compound material subjected to the degassing (Example 2) were plated with nickel, 0.3 μm of zincate surface treatment and 2 μm of electrolytic watt bath Ni, which were heated for 10 minutes in oxygen at a temperature of 350° C. Each blister of the surface plated layers of the obtained test pieces was examined. Ten samples were prepared for each and examined. Referring to FIG. 9, the blister of the plated layer was determined by measuring a width W of the blister of the plated layer 22. The results are shown in Table 2.

TABLE 2

| Example 2 | no blister of 5 μm (the maximum width W) or more |
|---|---|
| Comparative Example 2 | many blister of 10-20 μm (the maximum width W) or more were produced |

EXAMPLE 3

As the Example 1, the Al-Si compound material molded by hot working was prepared in accordance with FIG. 5. This Al-Si compound material was subjected to the above-described degassing. A test piece cut out of the Al-Si compound material not subjected to a degassing and a test piece cut out of the Al-Si compound material subjected to the degassing were prepared. The respective test piece surfaces were melted by heating using a YAG laser, and then solidified and the sections of the respective melted portions were compared with each other. As a result, it was found that while holes were produced in the test piece not subjected to a degassing, few holes were produced in the melted portion of the test piece subjected to the degassing. The irradiation by the laser beam was performed under the conditions that YAG laser pulse rate was 20 pulse/second, the pulse width was 7 msec, the Au dissolution content was 300 watt, and the travelling or sweep speed was 500 mm/min.

EXAMPLE 4

The following example was directed to radically effectively resolving the problem of the increase in the size of the particles of the welded portion.

Figure 10:
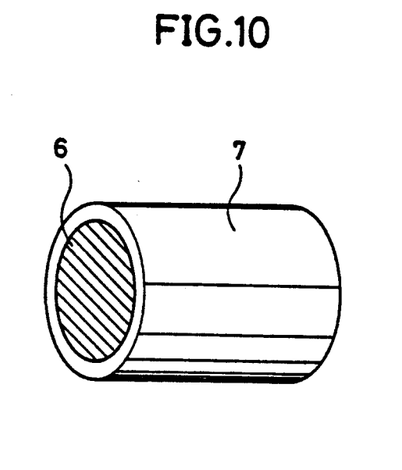
FIGS. 10 to 13 are diagrams showing the manufacturing steps for making a housing for a semiconductor device with an aluminum alloy layer provided on a surface of a cover attaching portion.

Referring to FIG. 10, the composite powder containing 60% by weight of Al and 40% by weight of Si, was molded by static pressure into a column shape having an outer diameter of 190 mm and a height of 300 mm and the molding was put in a sheath tube 7 made of aluminum having an outer diameter of 200 mm, a wall thickness of 5 mm and a length of 300 mm. An aluminum circular plate having an outer diameter of 200 mm and a thickness of 5 mm was welded to one end of the tube 7.

Figure 11:
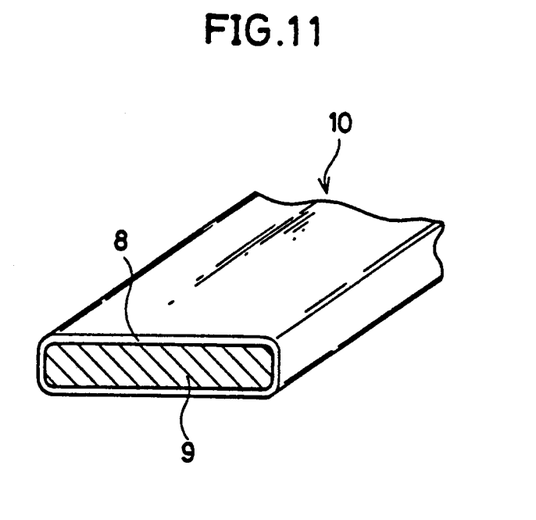
Figure 12:
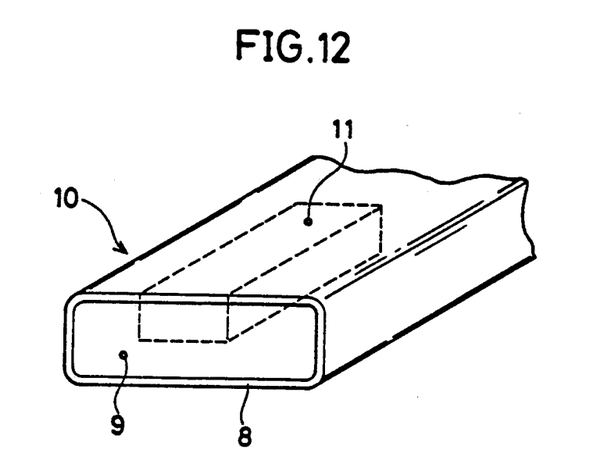

Referring to FIG. 11, the Al-Si powder in the sheath tube was loaded into a container of an extruder and extruded by an extrusion die having an outer diameter of 100 mm×20 mm to obtain a material 10 comprising an aluminum layer 8 around an Al-Si compound material 9. Then, the obtained material was subjected to a thermal process for two hours under a pressure of $10^{-3}$ torr or below, at a temperature of 450° C. As a result, the occlusion gas was removed from the inside of the material. Referring to FIG. 12, a cut material for a housing 11 was cut out of the material subjected to the degassing process such that the aluminum layer 8 appeared on the surface of the material.

Figure 13:
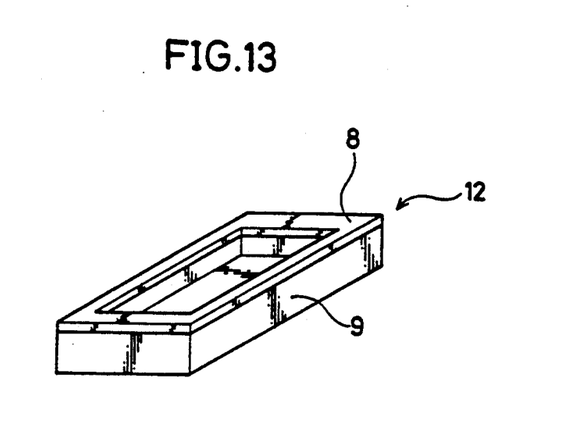

Thereafter, referring to FIG. 13, a housing 12 having an opening at the center was manufactured by a cutting or machining process.

Figure 14:
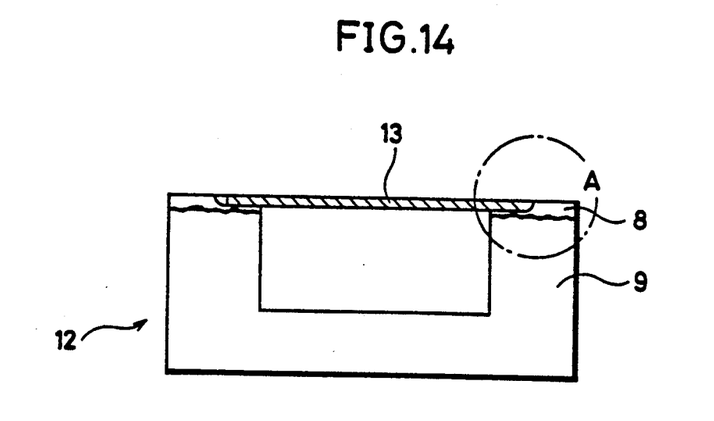
FIG. 14 is a sectional view of a housing for a semiconductor device comprising a housing member with an aluminum alloy layer provided on a surface of a cover attachment portion, and an aluminum cover attached by welding onto the housing member.

Referring to FIG. 14, an aluminum cover 13 of an aluminum alloy (Al-4032) was welded to the housing 12.

Figure 15:
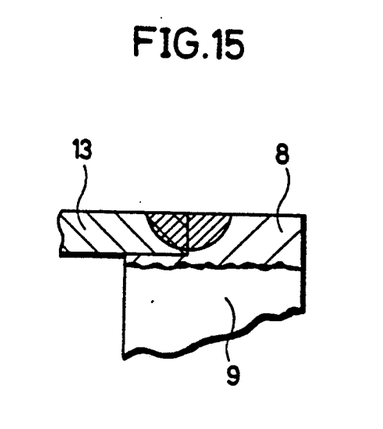
FIG. 15 is an enlarged view of the part A of FIG. 14.

FIG. 15 is a enlarged view of the welded portion between the housing 12 and the aluminum cover 13. Referring to FIG. 15, the material and the aluminum cover could be reliably connected to each other because the aluminum cover 13 and the aluminum layer 8 were welded.

EXAMPLE 5

Figure 16A:
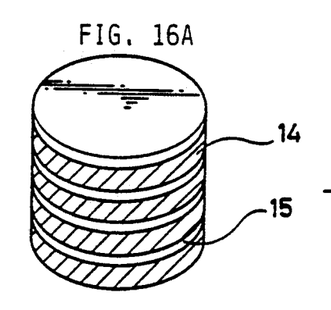
Figure 16B:
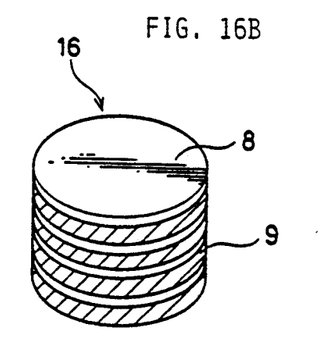

This is another example of a manufacturing method of a housing member with an aluminum alloy layer formed at a cover attachment portion. With reference to FIG. 16A Al-Si powder 14 and Al powder 15 were stacked in layers and the stack was molded by static pressure. Referring to FIG. 16B, thereafter, the molding was hot-pressed to obtain a material 16 in which the Al-Si compound materials 9 and the Al layers 8 were alternately stacked. Then, the material 16 was heated for two hours in a vacuum of $10^{-3}$ torr or below, at a temperature of 300°-500° C. to remove the occlusion gas contained in the material 16.

Figure 16C:
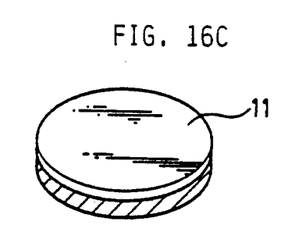

Thereafter, referring to FIG. 16C, the cut material for housing 11 was cut out so as to have the aluminum alloy layer 8 appear on the surface. Such a cut material for housing 11 can be also used for a housing producing the same effect as that of Example 4.

While in the above-described examples, an Al-Si compound material containing 40% by weight of Si is used the present invention is not limited thereto and a compound containing 30-45% by weight of Si can be preferably used.

The degassing taught by the invention has the advantage that no gas is emitted during a thermal treatment after the processing of the housing. Therefore, distortions due to exposure to heat caused by the occlusion gas have been prevented at the time of heating. As a result, a reliable housing for a semiconductor device has been obtained.

In addition, when an aluminum layer is formed at a cover attachment portion of the housing for a semiconductor device, the resulting aluminum cover can be reliably welded to the housing.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing a housing for a semiconductor device, comprising the following steps of:
   (a) preparing Al-Si rapidly solidified powder containing Si within the range of 30-45% by weight,
   (b) molding said Al-Si rapidly solidified powder by hot working to form an Al-Si compound material,
   (c) subjecting said Al-Si compound material molded by hot working to the conditions of a vacuum of $10^{-3}$ torr or below at a temperature of 300°-500° C. for substantially removing occlusion gas contained in said Al-Si compound material so that occlusion gas still remaining in said Al-Si compound material after removing said Al-Si material from said vacuum, contains nitrogen gas of 0.01% by weight or less, and
   (d) cutting said Al-Si compound material to form a housing member.

2. A method of manufacturing a housing for a semiconductor device, comprising the following steps of:
   (a) preparing Al-Si rapidly solidified powder containing Si within the range of 30-45% by weight,
   (b) molding said Al-Si rapidly solidified powder by static pressure to provide a molded member of an Al-Si compound and then putting said molded member of said Al-Si compound into a sheath tube made of an Al alloy,
   (c) molding by extruding said sheath tube and said molded member of said Al-Si compound as a unit for forming a clad material having an Al alloy layer provided around said Al-Si compound,
   (d) subjecting said clad material to the conditions of a vacuum of $10^{-3}$ torr or below at a temperature of 300°-500° C. for substantially removing occlusion gas contained in said Al-Si compound, whereby any occlusion gas still remaining in said clad material after removal from said vacuum, contains nitrogen gas of 0.01% by weight or less,
   (e) cutting said clad material so that said Al alloy layer appears on the surface of a cut material, and
   (f) further cutting said cut material to form a housing member.

3. A method of manufacturing a housing for a semiconductor device, comprising the following steps of:
   (a) preparing Al-Si rapidly solidified powder containing Si within the range of 30-45% by weight,
   (b) preparing an Al alloy powder, (c) alternately stacking layers of said Al-Si rapidly solidified powder and of said Al alloy powder to form a stack, (d) molding said stack by hot working for forming a hot worked material having alternately stacked layers of Al-Si compound material and of said Al alloy, (e) subjecting aid hot worked material to the conditions of a vacuum of $10^{-3}$ torr or below at a temperature of 300°–500° C. for substantially removing occlusion gas contained in said hot worked material so that occlusion gas still remaining in said hot worked material after removal from said vacuum, contains nitrogen gas of 0.01% by weight or less, (f) cutting said hot worked stack so that said Al alloy layers appear on the surface of the cut material, and (g) further cutting said cut material into a housing member.

* * * * *

UNITED STATES PATENT AND TRADEMARK OFFICE
CERTIFICATE OF CORRECTION

PATENT NO.  :  5,275,782

DATED       :  January 4, 1994

INVENTOR(S) :  Osada et al.

It is certified that error appears in the above-identified patent and that said Letters Patent is hereby corrected as shown below:

On the title page please insert:

[73] Assignee: Sumitomo Electric Industries, Ltd.
     Osaka, Japan

Column 9, line 8, replace "aid" by --said--.

On the title page, please insert: -Attorney, Agent or Firm-
                W. G. Fasse, D. H. Kane, Jr.-;

In [76[ Inventors, please replace "Tetsuya Hayoshi" by
                --Tetsuya Hayashi--.

Signed and Sealed this

Twenty-first Day of June, 1994

Attest:

BRUCE LEHMAN

Attesting Officer    Commissioner of Patents and Trademarks